United States Patent [19]

Sakai et al.

[11] Patent Number: 4,592,024

[45] Date of Patent: May 27, 1986

[54] SEMICONDUCTOR ROM

[75] Inventors: Kikuo Sakai, Hachiohji; Yoshiaki Onishi, deceased, late of Kokubunji; by Junko Onishi, administratrix, Nagoya, all of Japan

[73] Assignees: Hitachi, Ltd.; Hitachi Microcomputer Engineering Ltd., both of Tokyo, Japan

[21] Appl. No.: 510,319

[22] Filed: Jul. 1, 1983

[30] Foreign Application Priority Data

Jul. 2, 1982 [JP] Japan ................ 57-113916

[51] Int. Cl.⁴ ............................................. G11C 7/00
[52] U.S. Cl. ...................................... 365/200; 371/10
[58] Field of Search ............... 365/94, 104, 200, 201; 371/10, 11, 21

[56] References Cited

U.S. PATENT DOCUMENTS

| | | | |
|---|---|---|---|
| 3,585,378 | 5/1971 | Bouricius | 365/201 |
| 4,047,163 | 9/1977 | Choate et al. | 371/11 X |
| 4,055,754 | 10/1977 | Chesley | 371/21 |
| 4,489,402 | 12/1984 | Saitoh et al. | 365/200 |

FOREIGN PATENT DOCUMENTS

| | | |
|---|---|---|
| 1290973 | 3/1969 | Fed. Rep. of Germany . |
| 1524849 | 10/1970 | Fed. Rep. of Germany . |
| 1016469 | 1/1966 | United Kingdom . |
| 1340220 | 12/1973 | United Kingdom . |
| 1346219 | 2/1974 | United Kingdom . |
| 1528100 | 10/1978 | United Kingdom . |
| 1550675 | 8/1979 | United Kingdom . |
| 2034942 | 6/1980 | United Kingdom . |
| 2043308 | 10/1980 | United Kingdom . |
| 1580869 | 12/1980 | United Kingdom . |

Primary Examiner—Joseph A. Popek
Attorney, Agent, or Firm—Antonelli, Terry & Wands

[57] ABSTRACT

The address of each defective memory cell in a memory cell array is stored within a semiconductor ROM in advance. In parallel with the operation of reading out information from a memory cell of the array, whether or not the address of the memory cell agrees with the previously stored address of a defective memory cell is distinguished. When they agree, a correcting signal is formed. Erroneous data read out from the defective memory cell is inverted on the basis of the correcting signal and thus corrected, whereupon the corrected data is delivered out of the ROM. In using this error data correcting system, a read-out access time delay caused by furnishing the correcting function corresponds to only one stage of a logic circuit which is used for the inversion to correct the erroneous data. Thus, a semiconductor ROM furnished with an error correcting function can be provided without spoiling enhancement in the speed of the read-out operation.

16 Claims, 3 Drawing Figures

SEMICONDUCTOR ROM

BACKGROUND OF THE INVENTION

This invention relates to a semiconductor ROM (read only memory).

In the past, circuits have been developed which correct erroneous data read out from a defective memory cell, by the use of, e.g., the Hamming code or the cyclic code (hereinbelow, termed "ECC (error correcting code) circuit").

The inventors studied building an ECC circuit in a semiconductor ROM to the end of correcting erroneous data read out from a defective memory cell in the semiconductor ROM. However, when the ECC circuit is provided within the semiconductor ROM, the error correcting operation renders the read-out access time of the ROM long and the operating speed thereof much lower. Moreover, a memory array must be provided with memory cells for redundant bits, and the arrangement of the ECC circuit is complicated, resulting in the disadvantage that the chip size of the semiconductor ROM becomes large.

SUMMARY OF THE INVENTION

An object of this invention is to provide a semiconductor ROM which is furnished with an error correcting function without spoiling enhancement in the operating speed of the ROM on account of delay in the read-out access thereof.

Another object of this invention is to provide a semiconductor ROM which is furnished with an error correcting function without rendering a chip large in size.

The present invention has been made based on the fact that erroneous data read out from a defective memory cell in a ROM may be corrected merely by inverting the data.

In accordance with the present invention, the address information of a defective memory cell is stored within a semiconductor ROM in advance. In parallel with the information read-out operation of the defective memory cell, the address information thereof is distinguished as the address information of the defective memory cell. As a result, a correcting signal is formed. Erroneous data read out from the defective memory cell is inverted on the basis of the correcting signal, whereupon the corrected data is transmitted out of the ROM.

Defective memory cells can be attributed to imperfections of ROM producing technology as stated below. A photoresist film which is used for, e.g., selectively implanting impurity ions into a semiconductor substrate or selectively etching an insulating film or conductor layer, is sometimes not properly removed according to a desired pattern or comes to have undesired pinholes because of defects, motes or dust, etc. which exist in or on a mask for selectively exposing the photoresist film to light. When a photoresist film having such defects is used, the impurity ions cannot be implanted into the desired surface of the semiconductor substrate, or they are implanted into the undesired surface thereof. Further, the insulating film or conductor layer is not processed into the pattern as desired. The insulating film, such as silicon oxide film, which is deposited on a semiconductor substrate, often comes to have undesired uneven parts due to motes or dust, etc. The conductor layer, such as evaporated aluminum film, becomes thin in a part corresponding to the step part of an underlying surface on which it is to be deposited, because of the directivity of evaporation, with the result that the thin part is liable to disconnection.

In the present invention, in addition to defective memory cells ascribable to imperfections of the ROM producing technology, memory cells as stated below are also deemed defective memory cells. Specifically, in a case where, after the completion of the design of a ROM, it is desired to change information to be retained by some memory cells, these memory cells do not deliver output information to be expected and can be regarded as defective memory cells. In the present invention, accordingly, it is to be understood that the term "defective memory cell" signifies a memory cell which does not provide an output information to be expected.

DESCRIPTION OF THE PREFERRED EMBODIMENTS

Figure 1:
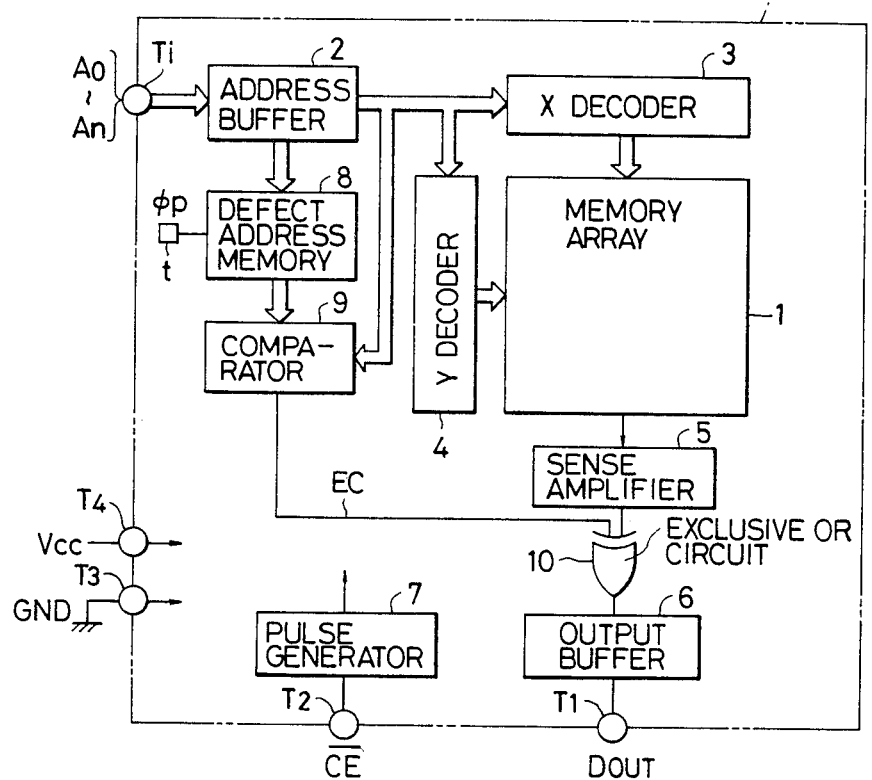
FIG. 1 is a circuit block diagram showing an embodiment of this invention.

FIG. 1 shows a block diagram of an embodiment of this invention.

Although not especially restricted thereto, circuit blocks enclosed with a two-dot chain line in the figure are formed on a single semiconductor substrate by known semiconductor IC technologies.

Numeral 1 designates a memory array, in which memory cells constituting a known mask type ROM are arranged in the shape of a matrix, though this is not especially restrictive.

Figure 3:
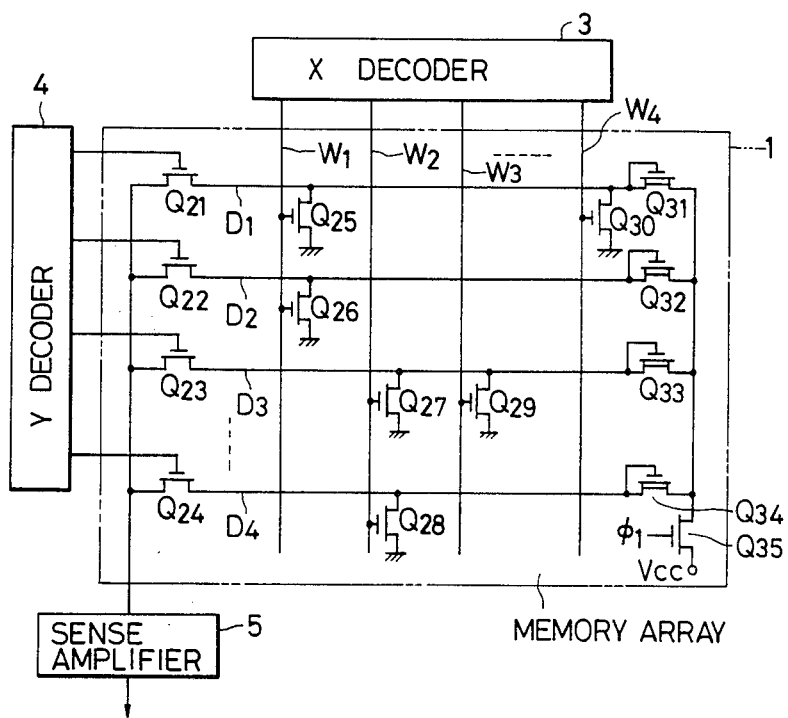
FIG. 3 is a circuit diagram showing an example of a memory array.

FIG. 3 shows an example of the memory array 1. The respective memory cells are formed at the intersection points between word lines $W_1$–$W_4$ to be selected by an X decoder 3 and data lines $D_1$–$D_4$ to be selected by a Y decoder 4. Although no special restriction is intended, memory MOSFETs are connected to the respective intersection points between the word lines and the data lines in FIG. 3. Each of the memory MOSFETs has a threshold voltage which corresponds to information to be retained. For example, information "1" is brought into correspondence with a low threshold voltage, and information "0" with a high threshold voltage. In FIG. 3, in order to simplify the illustration, there are omitted those memory MOSFETs of the memory MOSFETs connected to the intersection points between the word lines and the data lines which have the high threshold voltage, namely, which maintain their "off" states even when the word lines have been selected. In any event, the write-down of the information into each memory cell is executed depending upon how the MOSFET is formed. In the figure, MOSFETs $Q_{25}$–$Q_{30}$ are selectively formed, thereby to write information in. MOSFETs $Q_{21}$–$Q_{24}$ construct column switches which are controlled by the Y decoder 4. The column switches are disposed in order to supply a sense amplifier 5 with data read out on the data lines $D_1$–$D_4$. MOSFETs $Q_{31}$–$Q_{34}$ are load MOSFETs which determine read-out levels for the respective data lines. Although not especially restricted thereto, these load MOSFETs are depletion-mode MOSFETs whose gates and sources are short-circuited. A MOSFET $Q_{35}$ is provided in order to lower the power dissipation of the ROM. While the chip is not selected, the MOSFET $Q_{35}$ is turned "off", so that ineffective currents flowing through the load MOSFETs $Q_{31}$–$Q_{34}$ can be cut off. A gate input control pulse $\phi_1$ for the MOSFET $Q_{35}$ is formed by a pulse generator 7 to be described later.

Numeral 2 in FIG. 1 designates an address buffer, which receives external address signals $A_0$–$A_n$ applied to a group of external terminals $T_i$ and forms internal address signals $a_0$, $\overline{a_0}$–$a_i$, $a_i$ of complementary levels. The X decoder 3 referred to above forms one word line select signal in response to the X address signal fed from the address buffer 2. The Y decoder 4 referred to above forms one data line select signal in response to the Y address signal fed from the address buffer 2. The sense amplifier 5 referred to above then receives a read-out signal from one memory cell selected by the X decoder 3 and the Y decoder 4 and determines the level of the read-out signal in a known manner.

Figure 2:
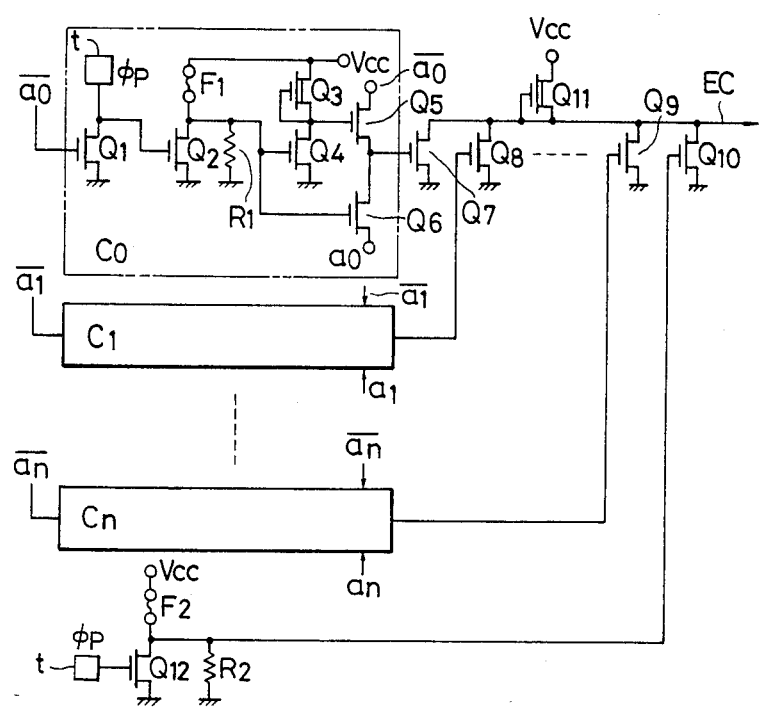
FIG. 2 is a circuit diagram showing an embodiment of the essential portions in FIG. 1.

Numeral 6 indicates an output buffer, which forms the read-out data signal $D_{OUT}$ and delivers it to an external terminal $T_1$. Supply voltages GND and $V_{CC}$ are respectively applied to external terminals $T_3$ and $T_4$ and are coupled to the circuit elements 1 through 7 in accordance with conventional techniques for implementing these elements. The connection of the voltages GND and $V_{CC}$ to elements 8 and 9 is shown in FIG. 2 and discussed hereinafter.

The pulse generator 7 referred to above receives a chip enable signal $\overline{CE}$ applied to an external terminal $T_2$ and forms necessary pulses for circuit operation of the various circuits in the ROM. For example, the circuit blocks are controlled by the pulse generator 7 to be in their operating states only when the chip has been selected. Such control achieves reduction in the power dissipation of the ROM, as illustrated, for example, by the operation of the transistor $Q_{35}$ in FIG. 3 discussed previously. In addition, when the chip is not selected, the address buffer 2 is brought into its non-operating state, whereby an address setting operation based on indefinite external address signals can be prevented.

Since the arrangements of the circuit blocks 1, 2, 3, 4, 5, 6 and 7 described above are well known to those in the art, practicable arrangements will not be explained.

In the above ROM, the following circuits are disposed in order to relieve defect bits, in other words, to correct erroneous data read out from defective memory cells. Numeral 8 denotes a defect address memory in which the address information of the defective (nonconforming) memory cells are written and retained. Although no special restriction is intended, the write-down of the defect address information is shown in FIG. 2 as being executed by the use of fuse elements and is based upon the presence or absence of the blowout of these fuse elements, as will be described later. A terminal t is a control terminal which is used for the write-down. The write-down is carried out after the ROM has been finished up on the semiconductor wafer and before it is packaged. Accordingly, the terminal t need not be an external terminal which is connected to a package lead.

Numeral 9 denotes a comparator which receives the defect address information from the defect address memory 8 and the read-out address information from the address buffer 2 and compares them so as to detect the coincidence thereof.

An exclusive OR circuit denoted by numeral 10 is disposed as an error correcting code circuit between the sense amplifier 5 and the output buffer 6.

One input of the exclusive OR circuit 10 is supplied with a read-out signal from the sense amplifier 5, while the other input thereof is supplied with the output signal EC of the comparator 9 as an error correcting signal. The output signal of the exclusive OR circuit 10 is transmitted to the input of the output buffer 6, and is delivered as the read-out data $D_{OUT}$ from the external terminal $T_1$.

Regarding the exclusive OR circuit 10, when the two input signal levels are non-coincident, the output signal level becomes "1", and conversely, when the two input signal levels are coincident, the output signal level becomes "0". Therefore, with this arrangement, when the information is read out from a defective memory cell in the memory array 1, the level of the coincidence detection output signal EC of the comparator 9 is brought to "1". Under the condition that the level of the signal EC is "1", if the output signal level of the sense amplifier 5 (read-out output signal level) is "0", the exclusive OR circuit 10 will invert this output signal level into "1" and deliver the latter, while, if the read-out output signal level of the sense amplifier 5 is "1", the circuit 10 will invert this output signal level into "0" and deliver the latter. Thus, the error correction of the data read out from the defective memory cell 1 can be made.

On the other hand, under the condition that the level of the signal EC is "0", if the output signal level of the sense amplifier 5 (read-out output signal level) is "0", the output signal level of the exclusive OR circuit 10 will become "0", and while, if the read-out output signal level of the sense amplifier 5 is "1", the output signal level of the exclusive OR circuit 10 will become "1". That is, in the case where the level of the signal EC is "0", the exclusive OR circuit 10 transmits the read-out output signal from the sense amplifier 5 to the output buffer 6 as it is since no error correction is necessary.

FIG. 2 shows the circuit arrangement of a practicable embodiment of the defect address memory 8 as well as the comparator 9.

Although not especially restricted thereto, this embodiment is constructed of n-channel MOSFETs (insulated-gate field effect transistors). Among these MOSFETs, load MOSFETs $Q_3$ and $Q_{11}$ are of the depletion mode, and the other MOSFETs are of the enhancement mode.

First, there will be explained a circuit $C_0$ enclosed with a two-dot chain line in FIG. 2. In this illustrated embodiment, the write-down of the address information of the defective memory cell is executed depending upon the presence or absence of the blowout of a fuse $F_1$. The fuse $F_1$ and MOSFET $Q_2$ are connected in series between the supply voltage $V_{CC}$ and the ground potential (GND) of the circuitry as supplied from connections to the terminals $T_3$ and $T_4$, shown in FIG. 1. Whether or not the fuse $F_1$ is blown out is determined by the "on"/"off" condition of the MOSFET $Q_2$. In order to selectively control the "on"/"off" of this MOSFET $Q_2$, there is provided a MOSFET $Q_1$ which receives the writing address signal $\overline{a_0}$, and an internal terminal t which is connected to the drain of the MOSFET $Q_1$. The drain output of this MOSFET $Q_1$ is applied to the gate of the MOSFET $Q_2$. The MOSFET $Q_2$ is provided with a high resistance $R_1$ in parallel. Although not especially restricted thereto, the resistance $R_1$ is constructed of an area of high resistance polycrystalline silicon.

The drain output of the MOSFET $Q_2$ is transmitted, on one hand, to an inverter which is composed of MOSFETs $Q_3$ and $Q_4$. The output of this inverter is transmitted to the gate of a transfer gate MOSFET $Q_5$. The drain output of the MOSFET $Q_2$ is transmitted, on the other hand, to the gate of a transfer gate MOSFET $Q_6$. The MOSFETs $Q_5$ and $Q_6$ are connected in series, and the address signals $\overline{a_0}$ and $a_0$ for comparing addresses are respectively applied through these MOSFETs $Q_5$ and $Q_6$. The MOSFETs $Q_3$–$Q_6$ described above and MOSFETs $Q_7$–$Q_{11}$ to be described later constitute the comparator 9 which detects the coincidence of comparison.

In a case where address information required for selecting a desired 1-bit memory cell is composed of the $(n+1)$ bits of from $a_0$ ($\overline{a_0}$) to $a_n$ ($\overline{a_n}$), circuits $C_1$ to $C_n$ similar to the aforementioned circuit $C_0$ are respectively disposed for the address signals $a_1$ ($\overline{a_1}$) to $a_n$ ($\overline{a_n}$) other than $a_0$ ($\overline{a_0}$), though no special restriction is intended.

A fuse $F_2$ is provided in order to write down whether or not the error correction function is to be added. More specifically, with the address memory and comparator circuit shown in FIG. 2, even if the particular memory cell is not defective, the level of the error correcting signal EC will be made "1" when the levels of the address signals $a_0$–$a_n$ are "0". The fuse $F_2$ serves to inhibit such a situation. The writing internal terminal t is connected to the gate of a MOSFET $Q_{12}$ which is connected in series with the fuse $F_2$. The MOSFET $Q_{12}$ is provided with a parallel high resistance $R_2$ similar to the foregoing resistance $R_1$.

The outputs of the circuits $C_0$–$C_n$ provided in correspondence with the address signals $a_0$ ($\overline{a_0}$)–$a_n$ ($\overline{a_n}$), and the drain output of the MOSFET $Q_{12}$ are transmitted to the gates of the MOSFETs $Q_7$ to $Q_{10}$ which constitute a NOR gate in the positive logic. The error correcting signal EC is derived from the output of this NOR gate.

The circuits of the arrangement shown in FIG. 2 form one set, and relieve one defective memory cell. Accordingly, in order to relieve the defects of m memory cells, m sets of the same circuits are prepared. Error correcting signals as described above and numbering m are transmitted to the exclusive OR circuit 10 through an OR circuit (not shown).

The write-down of the address information of the defective memory cell is performed in FIG. 2 as follows, but the invention is not especially restricted to this. First, all the bits of the memory array 1 shown in FIG. 1 are read out and checked. That is, written data and read data are compared. When both do not agree, the address of the defective memory cell in which the particular data has been stored is detected. The address information $A_i$ ($A_0$–$A_n$) of this defective memory cell is inputted from the plurality of external address terminals $T_i$. In this embodiment, among the internal address signals of complementary levels ($a_0$, $\overline{a_0}$) formed by the address buffer 2 in accordance with the address information, the inverted address signals $\overline{a_0}$–$\overline{a_n}$ are used as input data (write-down address information) to the defect address memory 8. That is, the inverted address signals $\overline{a_0}$–$\overline{a_n}$ are transmitted to the gates of the MOSFETs $Q_1$, etc. In addition, a signal $\phi_p$ to be impressed on the internal terminal t is made the high level. At this time, when the level of the write-down address signal $\overline{a_0}$ is "1" (high level), the MOSFET $Q_1$ turns "on" to turn "off" the MOSFET $Q_2$. Accordingly, no blowout current flows through the fuse $F_1$, so that the fuse $F_1$ is not blown out. In contrast, when the level of the write-down address signal $\overline{a_0}$ is "0" (low level), the MOSFET $Q_1$ turns "off" to turn "on" the MOSFET $Q_2$. Therefore, a blowout current flows through the fuse $F_1$, and the fuse $F_1$ is blown out.

The same applies to the other address signals $\overline{a_1}$–$\overline{a_n}$.

Further, the MOSFET $Q_{12}$ is turned "on" by the high level of the signal $\phi_p$ impressed on the internal terminal t, so that the blowout of the fuse $F_2$ is automatically effected.

In this way, the address information of the defective memory cell (defect address information) is written down.

With regard to a situation where the address memory and comparator circuit in which the defect address information are not written down, the fuse $F_2$ is not blown out. Therefore, even when all the address signals $a_0$–$a_n$ are "0", the MOSFET $Q_{10}$ is "on", so that the level of the error correcting signal EC is not made "1".

At any time other than the write-down stated above, for example, at the read-out operation of the ROM, the terminal t is held in its floating state. However, the MOSFET $Q_2$ is not turned "on" by the floating state. The reason is that a leakage current flowing through the MOSFET $Q_1$ sets the potential of the terminal t at ground potential, which is maintained by a stray capacitance coupled to the terminal. The potential of the terminal t is also brought to ground potential when the address signal $\overline{a_0}$ is brought to the high level to turn "on" the MOSFET $Q_1$. In the read-out operation, when the fuses $F_1$ and $F_2$ have been blown out, the drain outputs of the MOSFETs $Q_2$ and $Q_{12}$ become the low level "0" owing to the respective high resistances $R_1$ and $R_2$.

Now, in a case where the fuse $F_1$ is not blown out (when the address signal $a_0$ whose level is "0" has been written in the defect address memory shown in FIG. 2), the MOSFET $Q_6$ is "on" and the MOSFET $Q_5$ is "off". Accordingly, when the level of the read-out address signal $a_0$ is "1", this level "1" is transmitted to the gate of the MOSFET $Q_7$ through the MOSFET $Q_6$ so as to turn "on" the MOSFET $Q_7$. On the other hand, when the level of the read-out address signal $a_0$ is "0", this level "0" is transmitted to the gate of the MOSFET $Q_7$ through the MOSFET $Q_6$ so as to turn "off" the MOSFET $Q_7$.

In addition, in a case where the fuse $F_1$ has been blown out (when the address signal $a_0$ whose level is "1" has been written in the defect address memory shown in FIG. 2), the MOSFET $Q_5$ is "on" and the MOSFET $Q_6$ is "off". Accordingly, when the level of the read-out address signal $a_0$ is "0", the level "1" of the complementary signal $\overline{a_0}$ thereof is transmitted to the gate of the MOSFET $Q_7$ through the MOSFET $Q_5$ so as to turn "on" the MOSFET $Q_7$. On the other hand, when the level of the read-out address signal $a_0$ is "1", the level "0" of the complementary signal $\overline{a_0}$ thereof is transmitted to the gate of the MOSFET $Q_7$ through the MOSFET $Q_5$ so as to turn "off" the MOSFET $Q_7$.

Thus, according to the circuit described above, in a case where the level of the address signal $a_0$ stored in the defect address memory and that of the read-out address signal $a_0$ are non-coincident, the MOSFET $Q_7$ can be turned "on". In a case where they are coincident, the MOSFET $Q_7$ can be turned "off".

When all the read-out address signals $a_0$ ($\overline{a_0}$)–$a_n$ ($\overline{a_n}$) have coincided with the address signals stored in the defect address memory 8, that is, when the MOSFETs $Q_7$ to $Q_9$ are "off" ($Q_{10}$ is always "off" owing to the blowout of the fuse $F_2$), the selection of the defective memory cell is distinguished. As a result, the comparator 9 brings the level of the error correcting signal EC to "1". The exclusive OR circuit 10 receives the signal EC of the level "1" and the information from the defective memory cell, and corrects the error of the information.

The operation of distinguishing whether or not the defective memory cell is selected, is performed in parallel with the operation of reading out the memory cell information. When the read output signal is to be delivered from the sense amplifier 5, the error correcting signal EC has already been formed. In the error correcting system of this embodiment, accordingly, the time delay of the read-out access corresponds only to one stage of the exclusive OR circuit, and this delay time is very small. Therefore, even when the error correcting function is furnished, the speed of the read-out access can be enhanced.

In the case of employing the ECC circuit for the error correction, a large number of redundant bits are required. In contrast, according to this invention, no redundant bits are necessary, and the area occupied by the memory array is not increased.

Moreover, the circuit which corrects the error data upon detecting the fact of the address information of the defective memory cell is simpler in arrangement than conventional ECC circuits. Therefore, even when the error correcting function is furnished, in accordance with the present invention, the chip size of the ROM is not rendered large.

The read-out and check of all the bits of the memory array 1 and the write-down of the address information of the defective memory cells are carried out when the ROM has been finished up on the semiconductor wafer, and the terminal t for the write-down may be formed as an internal terminal in advance. Therefore, no external terminal needs to be added when the ROM has been finished up.

This invention is not restricted to the foregoing embodiments. For example, the fuses may be constructed in any known manner, such as of a conductor layer of aluminum or the like which is formed on a semiconductor chip through an insulating film or a MOSFET which is broken down.

The invention is applicable to ROMs other than the mask ROM. For example, it is also applicable to an EPROM (Erasable and Programmable ROM) employing memory devices into which information is electrically written. Besides, it is applicable to PROMs of the fuse type, the diode breakdown type, etc. In the EPROM, it is also allowed to replace the fuse elements with the memory devices and to write the address information of defective memory cells into the memory devices.

Although not especially restricted, such a memory device for defect storage has a source, a drain and a floating gate. When sufficient charges are stored in the floating gate, an inversion layer is formed between the source and the drain, and the source-drain path is steadily held in a conductive state. Depending upon whether the source-drain path is conductive or non-conductive, information for this memory device is written down. In order to erase the write-down information, the stored charges of the floating gate may be discharged by, e.g., the irradiation of the floating gate with ultraviolet-rays.

One advantage of using such a memory device instead of a fuse is that lower power dissipation for the write-down of the information can be achieved. The reason is that a comparatively great current which is necessary for the blowout of the fuse is not needed for the write-down into such memory device.

It is also allowed to employ a mask ROM for the memory array and to write the address information of the defective memory cell by utilizing the memory device stated above.

Further, in a ROM wherein n memory cells are appointed by one reading operation so as to obtain read-out data of n bits, defect bit positional information (digit) may be written down simultaneously with the write-down of the address information of the defective memory cell, whereby n exclusive OR circuits are selectively operated on the basis of the defect bit positional information so as to correct only specified defect data.

The application of the present invention is not restricted only to defective memory cells. In a case where undesired data has been written by mistake into a normal memory cell as to which write-down data and read-out data coincide, such erroneous data can be corrected and then delivered out of the ROM.

Also, although the preferred embodiment has been described based on the defect indicating signal being EC=1, it is to be understood that appropriate logic circuitry could also be provided based on the defect indicating signal being EC=0.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor ROM comprising:
a memory portion which includes a plurality of memory cells,
a selection circuit which selects one of the memory cells in response to input address signals,
a detection circuit which is capable of detecting predetermined combinations of the input address signals and for providing a detection signal when said predetermined combination of input address signals is detected, and
an output circuit comprising means having an exclusive OR function which receives a signal read out from said memory portion and the detection signal supplied from said detection circuit, and which performs an exclusive OR operation on said signal read out from said memory portion and said detection signal to produce a signal of a logic level corresponding to said signal read out from said memory portion when no detection signal is provided from said detection circuit, and a signal of a logic level not corresponding to said signal read out from said memory portion when a detection signal is provided from said detection circuit.

2. A semiconductor ROM according to claim 1, wherein said detection circuit includes programmable address information memory elements.

3. A semiconductor ROM according to claim 2, wherein said address information memory elements are fuse elements.

4. A semiconductor ROM according to claim 3, wherein said detection circuit comprises:

a plurality of address comparators each comprising a fuse element, and a pair of switching elements which are coupled to said fuse element such that their "on" and "off" states are controlled complementarily to one another in dependence upon whether said fuse element is in an open state or a closed state, said pair of switching elements being coupled to receive complementary input address signals and to produce a comparison output signal having a logic level which depends upon the states of said complementary input address signals and upon whether said fuse element is in an open state or a closed state, and a decoder circuit which receives the respective comparison output signals of said plurality of address comparators and which produces said detection signal in accordance with said comparison output signals.

5. A semiconductor ROM including an error correcting function comprising:

a memory portion which includes a plurality of memory cells, a selection circuit which selects one of the memory cells in response to input address signals, a detection circuit including an error storage circuit for storing addresses of known defective memory cells of said memory portion and detecting means coupled to said error storage circuit and to said selection circuit, said detecting means including means for determining when a memory cell selected by said selection circuit has an address corresponding to a defective memory cell address stored in said error storage circuit, and further including means for producing an error detection signal when said selected memory cell address corresponds to a stored defective memory cell address, and an output error correcting circuit comprising means having an exclusive OR function which receives a signal read out from said memory portion and said detection signal, and which performs an exclusive OR operation on said signal read out from said memory portion and said detection signal to produce a signal of a logic level corresponding to said signal read out from said memory portion when no error detection signal is provided from said detection circuit, and an error corrected signal of a logic level not corresponding to said signal read out from said memory portion when an error detection signal is provided from said detection circuit.

6. A semiconductor ROM according to claim 5, wherein said error storage circuit includes programmable address information memory elements.

7. A semiconductor ROM according to claim 6, wherein said address information memory elements are fuse elements.

8. A semiconductor ROM according to claim 7, wherein said detection circuit comprises:

a plurality of address comparators each comprising a fuse element, and a pair of switching elements which are coupled to said fuse element such that their "on" and "off" states are controlled complementarily to one another in dependence upon whether said fuse element is in an open state or a closed state, said pair of switching elements being coupled to receive complementary input address signals and to produce a comparison output signal having a logic level which depends upon the states of said complementary input address signals and upon whether said fuse element is in an open state or a closed state, and a decoder circuit which receives the respective comparison output signals of said plurality of address comparators and which produces said error detection signal in accordance with said comparison output signals.

9. A semiconductor ROM according to claim 8, wherein said detection circuit further includes means coupled to said decoder circuit output for preventing the production of said error detection signal unless an address of a known defective memory cell has been stored in the error storage circuit of the detection circuit.

10. A semiconductor ROM according to claim 9, wherein said prevention means includes a fuse and a switching means, said switching means having its state controlled between first and second states in accordance with whether said fuse is in an open state or a closed state, and wherein said switching is coupled in said detection circuit to permit the production of an error detection signal when said switching means in in a first state and to prevent the production of an error detection signal when said switching means is in a second state.

11. A semiconductor ROM according to claim 5, wherein said detection circuit further includes means coupled to said detection circuit output for preventing the production of said error detection signal unless an address of a known defective memory cell has been stored in the error storage circuit of the detection circuit.

12. A semiconductor ROM according to claim 11, wherein said prevention means includes a fuse and a switching means, said switching means having its state controlled between first and second states in accordance with whether said fuse is in an open state or a closed state, and wherein said switching is coupled in said detection circuit to permit the production of an error detection signal when said switching means is in a first state and to prevent the production of an error detection signal when said switching means is in a second state.

13. A semiconductor ROM comprising:

a memory portion which includes a plurality of memory cells, a selection circuit which selects one of the memory cells in response to input address signals, a detection circuit which is capable of detecting predetermined combinations of the input address signals and for providing a detection signal when said predetermined combination of input address signals is detected, and an output circuit which receives a signal read out from said memory portion and which delivers a signal of a logic level corresponding to said signal read out from said memory portion when no detection signal is provided from said detection circuit, and a signal of a logic level not corresponding to said signal read out from said memory portion when a detection signal is provided from said detection circuit, wherein said detection circuit includes programmable address information memory elements comprised of fuse elements, and further wherein said detection circuit comprises:

a plurality of address comparators each comprising a fuse element, and a pair of switching elements which are coupled to said fuse element such that their "on" and "off" states are controlled complementarily to one another in dependence upon whether said fuse element is in an open state or a closed state, said pair of switching elements being coupled to receive complementary input address signals and to produce a comparison output signal having a logic level which depends upon the states of said complementary input address signals and upon whether said fuse element is in an open state or a closed state, and a decoder circuit which receives the respective comparison output signals of said plurality of address comparators and which produces said detection signal in accordance with said comparison output signals.

14. A semiconductor ROM including an error correcting function comprising:

a memory portion which includes a plurality of memory cells, a selection circuit which selects one of the memory cells in response to input address signals, a detection circuit including an error storage circuit for storing addresses of known defective memory cells of said memory portion and detecting means coupled to said error storage circuit and to said selection circuit, said detecting means including means for determining when a memory cell selected by said selection circuit has an address corresponding to a defective memory cell address stored in said error storage circuit, and further including means for producing an error detection signal when said selected memory cell address corresponds to a stored defective memory cell address, and an output error correcting circuit which receives a signal read out from said memory portion and said detection signal, and which delivers a signal of a logic level corresponding to said signal read out from said memory portion when no error detection signal is provided from said detection circuit, and an error corrected signal of a logic level not corresponding to said signal read out from said memory portion when an error detection signal is provided from said detection circuit, wherein said error storage circuit includes programmable address information memory elements comprised of fuse elements, and further wherein said detection circuit comprises:

a plurality of address comparators each comprising a fuse element, and a pair of switching elements which are coupled to said fuse element such that their "on" and "off" states are controlled complementarily to one another in dependence upon whether said fuse element is in an open state or a closed state, said pair of switching elements being coupled to receive complementary input address signals and to produce a comparison output signal having a logic level which depends upon the states of said complementary input address signals and upon whether said fuse element is in an open state or a closed state, and a decoder circuit which receives the respective comparison output signals of said plurality of address comparators and which produces said error detection signal in accordance with said comparison output signals.

15. A semiconductor ROM according to claim 14, wherein said detection circuit further includes means coupled to said decoder circuit output for preventing the production of said error detection signal unless an address of a known defective memory cell has been stored in the error storage circuit of the detection circuit.

16. A semiconductor ROM according to claim 15, wherein said prevention means includes a fuse and a switching means, said switching means having its state controlled between first and second states in accordance with whether said fuse is in an open state or a closed state, and wherein said switching is coupled in said detection circuit to permit the production of an error detection signal when said switching means is in a first state and to prevent the production of an error detection signal when said switching means is in a second state.

* * * * *